United States Patent
Choi et al.

(10) Patent No.: US 10,547,315 B2
(45) Date of Patent: Jan. 28, 2020

(54) FREQUENCY DIVIDER AND A TRANSCEIVER INCLUDING THE SAME

(71) Applicant: SAMSUNG ELECTRONICS CO., LTD., Suwon-si, Gyeonggi-Do (KR)

(72) Inventors: Jae-won Choi, Suwon-si (KR); Nam-seog Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/202,172

(22) Filed: Nov. 28, 2018

(65) Prior Publication Data

US 2019/0165790 A1 May 30, 2019

(30) Foreign Application Priority Data

Nov. 28, 2017 (KR) .................. 10-2017-0161007
Jul. 5, 2018 (KR) .................. 10-2018-0078249

(51) Int. Cl.
| | | |
|---|---|---|
| *H03K 21/02* | (2006.01) | |
| *H03K 3/037* | (2006.01) | |
| *H03K 7/08* | (2006.01) | |
| *H04B 1/40* | (2015.01) | |

(52) U.S. Cl.
CPC ............ *H03K 21/02* (2013.01); *H03K 3/037* (2013.01); *H03K 7/08* (2013.01); *H04B 1/40* (2013.01)

(58) Field of Classification Search
CPC combination set(s) only.
See application file for complete search history.

(56) References Cited

U.S. PATENT DOCUMENTS

| | | |
|---|---|---|
| 5,442,670 A | 8/1995 | Shu |
| 6,121,801 A | 9/2000 | Lee |
| 6,356,123 B1 | 3/2002 | Lee et al. |
| 6,611,573 B2 | 8/2003 | Trivedi et al. |
| 6,958,633 B2 | 10/2005 | Chien |
| 7,183,824 B2 * | 2/2007 | Park .................. G11C 11/15 327/172 |
| 7,492,852 B1 | 2/2009 | Liu |
| 7,734,001 B2 | 6/2010 | Saeki |
| 8,154,331 B2 * | 4/2012 | Kim .................. H03K 5/1565 327/172 |

(Continued)

*Primary Examiner* — An T Luu
(74) *Attorney, Agent, or Firm* — F. Chau & Associates, LLC

(57) ABSTRACT

A frequency divider may include: a core circuit including a first flip-flop loop and a second flip-flop loop, wherein each of the first flip-flop loop and the second flip-flop loop divides a frequency of a clock signal received via a control terminal of a flip-flop, wherein the core circuit is configured to: output a frequency-divided signal, based on a first signal output by the first flip-flop loop and a second signal output by the second flip-flop loop, the first and second signals having same frequency-division ratios and different phases, and feed back the frequency-divided signal via an input terminal of each of the first and second flip-flop loops; a duty correction circuit that receives the frequency-divided signal and outputs a differential output signal that is generated by correcting a duty ratio of the frequency-divided signal; and an output circuit that outputs a first output signal, which is a signal amplified from the differential output signal, and a second output signal that is a quadrature signal of the first output signal.

19 Claims, 10 Drawing Sheets

(56) References Cited

U.S. PATENT DOCUMENTS

| | | |
|---|---|---|
| 8,174,301 B2 | 5/2012 | Braun et al. |
| 8,175,214 B2 * | 5/2012 | Zeller ................. H03K 23/665 |
| | | 327/115 |
| 8,258,839 B2 | 9/2012 | Erdogan |
| 8,471,607 B1 * | 6/2013 | Pace ...................... H03K 23/54 |
| | | 327/115 |
| 8,704,557 B2 | 4/2014 | Malmcrona et al. |
| 8,803,568 B2 | 8/2014 | Leung et al. |
| 9,007,132 B2 | 4/2015 | Ding |
| 9,270,280 B1 | 2/2016 | Margarit et al. |
| 2006/0280278 A1 * | 12/2006 | Schabel ................ H03K 21/38 |
| | | 377/47 |

* cited by examiner

US 10,547,315 B2

FREQUENCY DIVIDER AND A TRANSCEIVER INCLUDING THE SAME

CROSS-REFERENCE TO RELATED APPLICATIONS

This application claims priority under 35 U.S.C. § 119 to Korean Patent Application No. 10-2017-0161007 filed on Nov. 28, 2017 in the Korean Intellectual Property Office (KIPO) and Korean Patent Application No. 10-2018-0078249 filed on Jul. 5, 2018 in the KIPO, the disclosures of which are incorporated by reference herein in their entireties.

TECHNICAL FIELD

The inventive concept relates to a frequency divider and a transceiver including the same, and more particularly, to a frequency divider that corrects a duty ratio, and a transceiver including the same.

DISCUSSION OF RELATED ART

A frequency divider divides the frequency of an input signal and generates an output signal that has frequency lower than that of the input signal. For example, the frequency divider is a circuit that takes an input signal, divides it and generates an output signal. A frequency divider may be used for a clock generation circuit, for example, a local oscillator, a phase-locked loop (PLL), a frequency synthesizer, and the like, and various kinds of Integrated circuits including the clock generation circuit. A frequency divider may be classified as an integer frequency divider that divides frequency by an integer N or a fractional frequency divider that divides frequency by, for example, N.5. In the integer frequency divider, a pulling effect may occur in a radio-frequency (RF) transceiver to which a signal source with a large output is applied. In the fractional frequency divider, the pulling effect may not occur when a signal source with a large output is applied thereto. However, the fractional frequency divider delays cycle signals and frequency spur, which is an unintended frequency, occurring in a frequency division process.

In addition, the fractional frequency divider generally outputs a duty ratio of 40% or 60%, and may not be easily applied to a system requiring a 50% duty ratio.

SUMMARY

According to an exemplary embodiment of the inventive concept, there is provided a frequency divider including: a core circuit including a first flip-flop loop and a second flip-flop loop, wherein each of the first flip-flop loop and the second flip-flop loop divides a frequency of a clock signal received via a control terminal of a flip-flop, wherein the core circuit is configured to: output a frequency-divided signal, based on a first signal output by the first flip-flop loop and a second signal output by the second flip-flop loop, the first and second signals having same frequency-division ratios and different phases, and feed back the frequency-divided signal via an input terminal of each of the first and second flip-flop loops; a duty correction circuit that receives the frequency-divided signal and outputs a differential output signal that is generated by correcting a duty ratio of the frequency-divided signal; and an output circuit that outputs a first output signal, which is a signal amplified from the differential output signal, and a second output signal that is a quadrature signal of the first output signal.

According to an exemplary embodiment of the inventive concept, there is provided a frequency divider including: a core circuit that receives a clock signal and outputs a frequency-divided signal which is generated by dividing a frequency of the clock signal; and a duty correction circuit that receives the frequency-divided signal and outputs a differential output signal that has a new duty ratio according to decision levels, wherein the duty correction circuit, by performing feedback on the differential output signal and adjusting an edge slope of the frequency-divided signal based on the differential output signal that is fed back, adjusts an original duty ratio such that the differential output signal has the new duty ratio.

According to an exemplary embodiment of the inventive concept, there is provided a transceiver including: a core circuit that receives a clock signal, outputs a frequency-divided signal that is generated by dividing a frequency of the clock signal, and comprises a first flip-flop loop and a second flip-flop loop each including a plurality of flip-flops; and a duty correction circuit that receives the frequency-divided signal and outputs a differential output signal that is generated by correcting a duty ratio of the frequency-divided signal.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the attached drawings.

Figure 1:
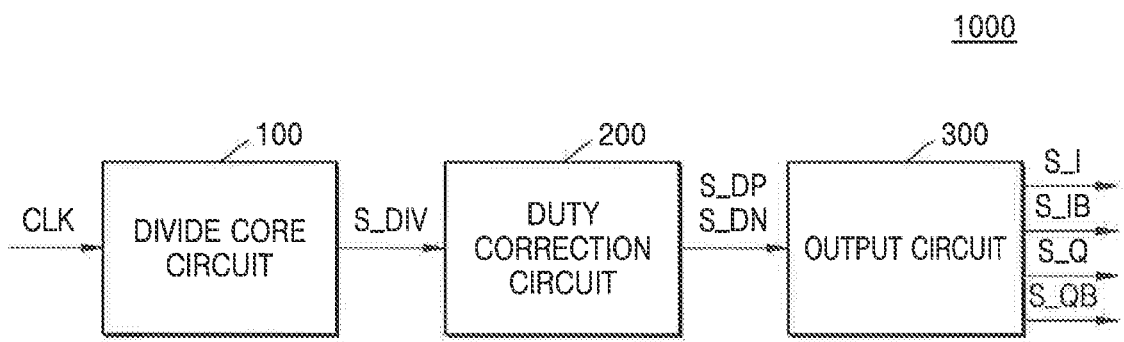
FIG. 1 is a block diagram of a frequency divider according to an exemplary embodiment of the inventive concept.
Figure 2:
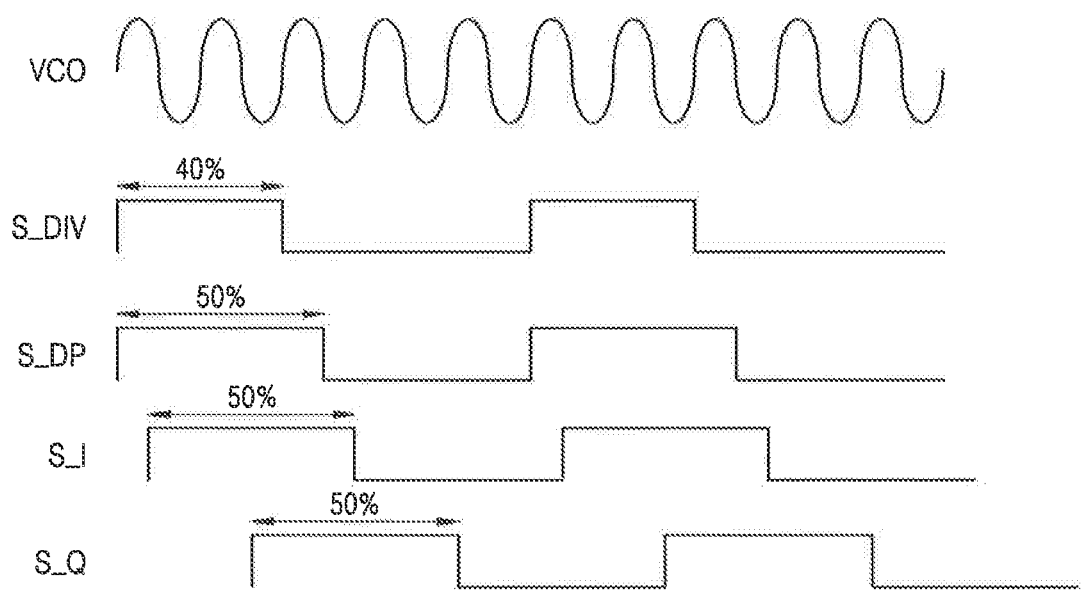
FIG. 2 is a waveform diagram of signals of a frequency divider according to an exemplary embodiment of the inventive concept.

FIG. 1 is a block diagram of a frequency divider according to an exemplary embodiment of the inventive concept, and FIG. 2 is a waveform diagram of signals of the frequency divider according to an exemplary embodiment of the inventive concept.

Referring to FIG. 1, a frequency divider 1000 may include a divide core circuit 100, a duty correction circuit 200, and an output circuit 300. The divide core circuit 100 may receive a clock signal CLK and output a frequency-divided signal S_DIV having a divided frequency. The duty correction circuit 200 receives the frequency-divided signal S_DIV and outputs differential output signals S_DP and S_DN each having a corrected duty ratio. The output circuit 300 receives the differential output signals S_DP and S_DN and outputs output signals S_I, S_IB, S_Q, S_QB orthogonal to one another.

Referring to FIG. 2, the clock signal CLK may be generated based on signals output from a voltage-controlled oscillator VCO. The frequency-divided signal S_DIV is calculated by dividing the frequency of the clock signal CLK by a certain value, and the duty ratio may, for example, be 40% or 60%. The differential output signals S_DP and S_DN may include a first differential output signal S_DP and a second differential output signal S_DN, and the differential output signals S_DP and S_DN may be signals inverted with respect to each other. The differential output signals S_DP and S_DN may, by using the duty correction circuit 200, correct the duty ratio of the frequency-divided signal S_DIV. For example, the duty correction circuit 200 may correct a frequency-divided signal S_DIV having a duty ratio of 40% to have a duty ratio of 50%. Quadrature signals may include first output signals S_I and S_IB and second output signals S_Q and S_QB. The first output signals S_I and S_IB each have an In-phase component. For example, the first output signals S_I and S_IB have phases similar to that of the first differential output signal S_DP. The second output signals S_Q and S_QB each have a quadrature component. The second output signals S_Q and S_QB each have a phase orthogonal to the first differential output signal S_DP, for example. The first output signals S_I and S_IB may include the I signal S_I and the IB signal S_IB having a gap of half a cycle therebetween. In other words, the I signal S_I and the IB signal S_IB are signals inverted with respect to each other. The second output signals S_Q and S_QB may also include the Q signal S_Q and the QB signal S_QB having a gap of half a cycle therebetween.

Referring again to FIG. 1, the divide core circuit 100 may include a plurality of flip-flops. The plurality of flip-flops may include a first flip-flop loop and a second flip-flop loop. Each of the flip-flop loops may receive a clock signal CLK. For example, the first flip-flop loop and the second flip-flop loop may output frequency modulation signals of the clock signal CLK. The frequency modulation signals output by the first flip-flop loop and the second flip-flop loop may have the same magnitudes and different phases. In other words, the frequency modulation signals may be output in phase-shifted forms. A frequency-divided signal S_DIV, which is generated by dividing a frequency of the clock signal CLK, may be output by summing up the frequency modulation signals output by the first flip-flop loop and the second flip-flop loop.

The duty correction circuit 200 may correct a duty ratio of the frequency-divided signal S_DIV to have a certain value. According to an exemplary embodiment of the inventive concept, the duty correction circuit 200 may apply the frequency-divided signal S_DIV to a primary circuit (for example, a resistor-capacitor (RC) filter) including a resistor and a capacitor. The frequency-divided signal S_DIV that passes through the primary circuit has a primary response with a rising time, and the primary response may be a signal having a certain duty ratio (for example, a duty ratio of 50%) due to a decision level of a plurality of inverters. In this case, the resistor included in the primary circuit may be a variable resistor that is adjusted by an output voltage of an operational amplifier that fed back the differential output signals S_DP and S_DN and received the same.

The output circuit 300 may receive the differential output signals S_DP and S_DN and output the first output signals S_I and S_IB and the second output signals S_Q and S_QB orthogonal to one another. The first output signals S_I and S_IB are output signals orthogonal to the second output signals S_Q and S_QB.

According to an exemplary embodiment of the inventive concept, the output circuit 300 receives the differential output signals S_DP and S_DN and outputs the first output signals S_I and S_IB by using a buffer that only causes amplitude changes. The output circuit 300 receives the differential output signals S_DP and S_DN and outputs the second output signals S_Q and S_QB respectively having phases delayed by 90 degrees by using the buffer and a phase delay circuit.

In this case, the output circuit 300 may delay the phases based on the first output signals S_I and S_IB and the second output signals S_Q and S_QB. In other words, the output circuit 300 may control the delayed phases of the second output signals S_Q and S_QB by performing feedbacks on the output signals. According to an exemplary embodiment of the inventive concept, an operational amplifier that receives the first output signals S_I and S_IB and the second output signals S_Q and S_QB may provide a delay control signal that delays phases to a delay circuit in the output circuit 300. In other words, the output circuit 300 may delay the phases by performing feedbacks on the first output signals S_1 and S_IB and the second output signals S_Q and S_QB.

As described below with reference to FIGS. 9 and 10, the phase delay in the output circuit 300 may be sensitive to changes in temperatures and voltages. To accomplish this, the driving voltage provided to the buffer and the delay circuit included in the output circuit 300 may be controlled by using a voltage control circuit including a current source that varies according to temperature changes.

The frequency divider 1000 described above may perform frequency division at a CMOS level, based on the clock signal CLK, and may output a quadrature signal having a corrected duty ratio once. Accordingly, the frequency divider 1000 may provide the output signals S_I, S_IB, S_Q, and S_QB each having a duty ratio of 50%, little frequency spur, and orthogonal to one another.

Figure 3A:
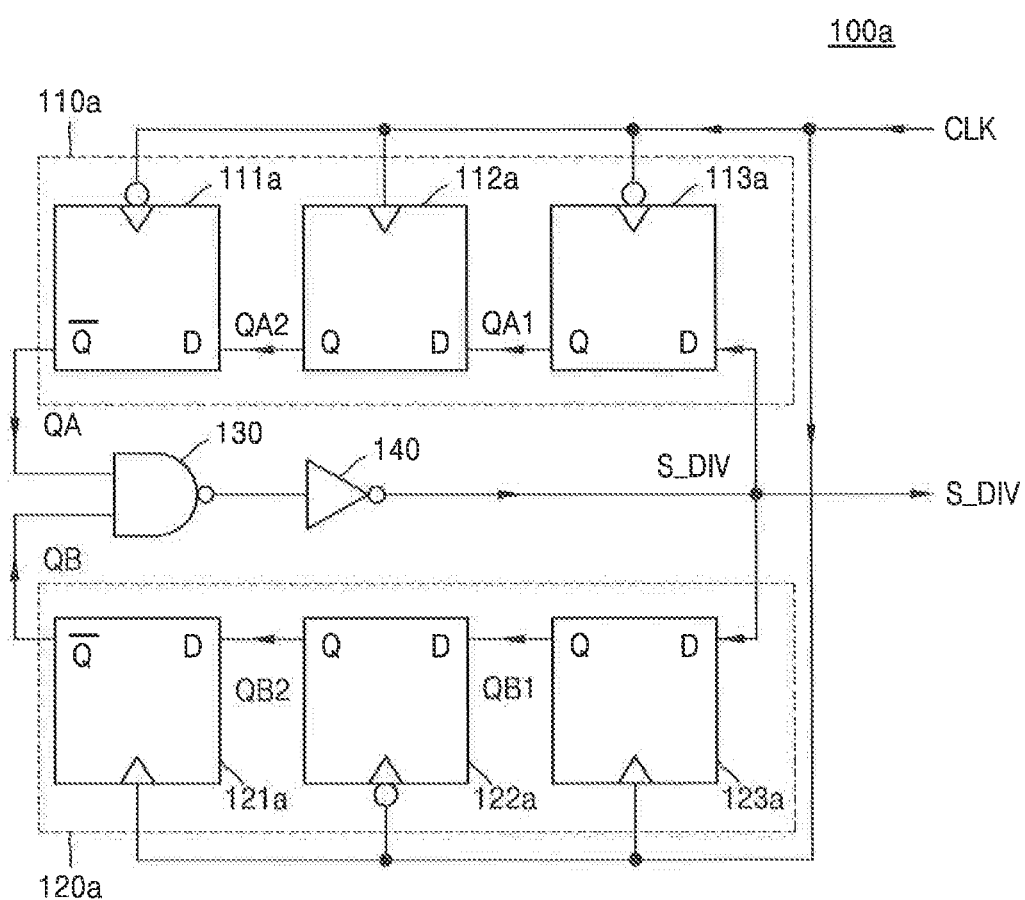
FIGS. 3A and 3B are circuit diagrams of divide core circuits according to an exemplary embodiment of the inventive concept.
Figure 3B:
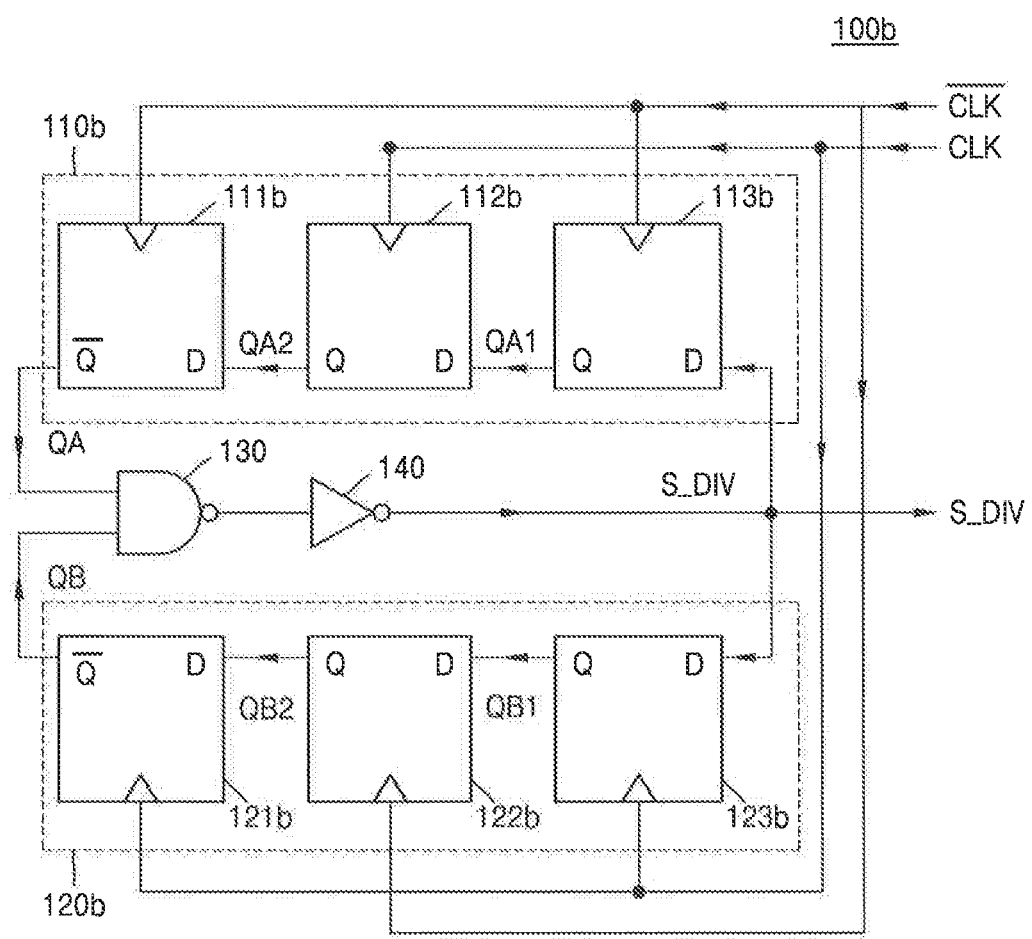

FIGS. 3A and 3B are circuit diagrams of divide core circuits according to an exemplary embodiment of the inventive concept.

Referring to FIG. 3A, a divide core circuit 100a may include a first flip-flop loop 110a, a second flip-flop loop 120*a*, a plurality of flip-flops 111*a*, 112*a*, 113*a*, 121*a*, 122*a* and 123*a*, a NAND gate 130, and an inverter 140.

According to an exemplary embodiment of the inventive concept, the first flip-flop loop 110*a* and the second flip-flop 120*a* respectively include the plurality of flip-flops 111*a* through 113*a* and 121*a* through 123*a*. For example, a flip-flop may be a D flip-flop. Each of the flip-flops 111*a* through 113*a* and 121*a* through 123*a* includes a control terminal for receiving a clock signal CLK, a D input terminal to which a logic value is input, and a Q output terminal and a $\overline{Q}$ terminal that output the logic value. Lines formed at the input terminals and the output terminals are referred to as data lines.

According to a truth table of the flip-flop, when a control signal (for example, a CLK input to the control terminal is 0, regardless of the logic value input to the D input terminal, the control signal maintains a previous Q or $\overline{Q}$. In addition, when the control signal is 1 and a logic value input to the D input terminal is 0, Q outputs a logic value of 0 and $\overline{Q}$ outputs a logic value of 1. On the other hand, when the control signal is 1 and a logic value input to the D input terminal is 1, Q outputs a logic value of 1 and $\overline{Q}$ outputs a logic value of 0. According to an exemplary embodiment of the inventive concept, the first flip-flop loop 110*a* and the second flip-flop loop 120*a* respectively include the plurality of flip-flops 111*al* through 113*a* and 121*a* through 123*a*, and each of the plurality of flip-flops 111*a* through 113*a* and 121*a* through 123*a* receives a clock signal CLK or a signal inverted from the clock signal CLK. For example, the first flip-flop loop 110*a* includes the flip-flop 112*a* for receiving the clock signal CLK and the flip-flops 111*a* and 113*a* respectively receiving the signal inverted from the clock signal CLK. The second flip-flop loop 120*a* includes the flip-flops 121*a* and 123*a* each receiving the clock signal CLK and the flip-flop 122*a* for receiving the signal inverted from the dock signal CLK. In other words, the divide core circuit 100*a* may perform frequency division by directly or inversely receiving the clock signal CLK, or by shifting the clock signal CLK stepwise at each flip-flop.

In this case, as shown in FIG. 3A, the clock signal CLK may be inverted and received by the flip-flops 111*a*, 113*a*, and 122*a*. However, according to another exemplary embodiment of the inventive concept, as shown in FIG. 3B, a clock signal CLK and a clock inversion signal $\overline{CLK}$ may be applied to a divide core circuit 100*b*.

Referring to FIG. 3B, the clock signal CLK and the clock inversion signal $\overline{CLK}$ may be provided by an external signal source. The dock inversion signal $\overline{CLK}$ has a phase gap by half a cycle from the dock signal CLK. In other words, clock inversion signal $\overline{CLK}$ is inverted with respect to the clock signal CLK. For example, two signal input lines may be provided from the external signal source placed outside the divide core circuit 100*b*, and the signal input lines may respectively provide the clock signal CLK and the clock inversion signal $\overline{CLK}$ to the divide core circuit 100*b*. In this case, unlike in FIG. 3A, control terminals of a plurality of flip-flops included in the core circuit 100*b* receive control signals without inversion. For example, referring to FIG. 3B, flip-flops 112*b*, 121*b*, and 123*b* may receive the clock signal CLK, and flip-flops 111*b*, 113*b*, and 122*b* may receive the clock inversion signal $\overline{CLK}$. Hereinafter, as FIGS. 3A and 3B are substantially identical to each other in terms of operation of the flip-flop loops 110*a*, 110*b*. 120*a* and 120*b*, thus, for convenience of explanation, the flip-flops will be described with reference to the divide core circuit 100*a* in FIG. 3A.

Referring again to FIG. 3A, the first flip-flop loop 110*a* and the second flip-flop loop 120*a* respectively include the same number of flip-flops. According to an exemplary embodiment of the inventive concept, each of the first flip-flop loop 110*a* and the second flip-flop loop 120*a* may include three flip-flops. The flip-flop 113*a* of the first flip-flop loop 110*a*, to which the frequency-divided signal S_DIV is fed back and input through the D terminal, may receive the signal inverted from the clock signal CLK through the control terminal. The flip-flop 123*a* of the second flip-flop loop 120*a*, to which the frequency-divided signal S_DIV is fed back and input through the D terminal, may receive the clock signal CLK through the control terminal. Of the plurality of flip-flops 111*a* through 113*a* and 121*a* through 123*a* Included in the first flip-flop loop 110*a* and the second flip-flop loop 120*a*, flip-flops receiving the clock signal CLK and flip-flops receiving the signal inverted from the clock signal CLK may be connected to the D terminal or the Q terminal in alternating order. The relationship between the signals input and output in the flip-flop loops (e.g., 110*a* and 120*a*) will be described in detail in FIG. 4.

Figure 4:
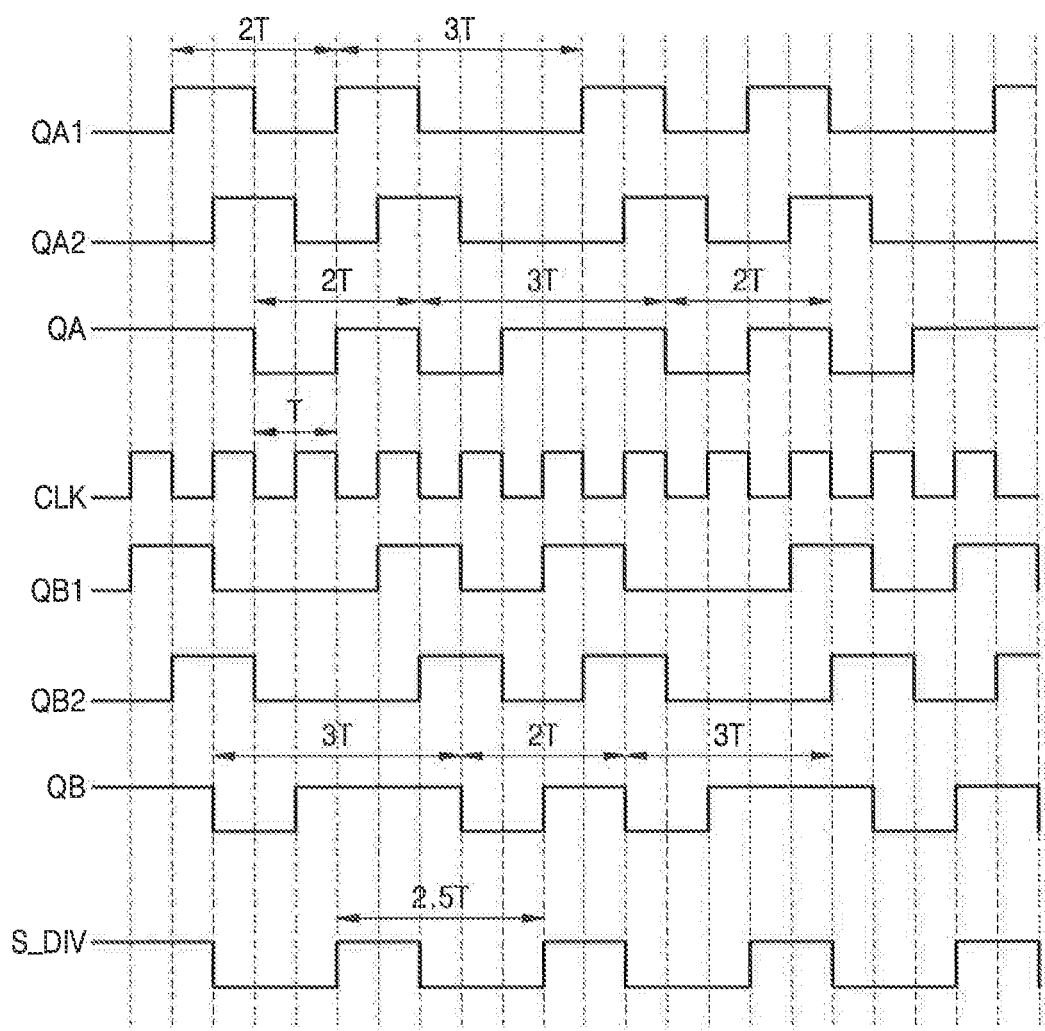
FIG. 4 is a timing diagram of signals input or output by the divide core circuit according to an exemplary embodiment of the inventive concept.

FIG. 4 is a timing diagram of signals input or output by the divide core circuit according to an exemplary embodiment of the inventive concept. For convenience of explanation, FIG. 4 will be described with reference to identifiers used in FIG. 3A.

Referring to FIG. 4, the clock signal CLK is a voltage that repeats a logic-low voltage and a logic-high voltage for a cycle T and may be input to the control terminals of the plurality of flip-flops 111*a* through 113*a* and 121*a* through 123*a* included in the first flip-flop loop 110*a* and the second flip-flop loop 120*a*. The first and second flip-flop loops 110*a* and 120*a* may receive a frequency-divided signal S_DIV via the D terminals and respectively output a QA signal and a QB signal. In this case, as shown in FIG. 4, each of the QA signal and the QB signal has a cycle of 5T, and thus, the QA signal and the QB signal have the same frequency division ratios.

The flip-flop 113*a* may receive the signal inverted from the clock signal CLK via the control terminal and receive the frequency-divided signal S_DIV via the D input terminal. According to a truth table of the flip-flop 113*a*, a QA1 signal may be output via the Q output terminal. In other words, the first flip-flop loop 110*a* may generate the QA1 signal having 5 T as a cycle, e.g., 2T+3 T as shown in FIG. 4.

The flip-flop 112*a* may receive the clock signal CLK via the control terminal and the QA1 signal (from the flip-flop 113*a*) via the D input terminal, thereby outputting a QA2 signal via the Q output terminal. In other words, the flip-flop 112*a* receives the signal inverted from the clock signal CLK via the control terminal and may output the QA2 signal by receiving the clock signal CLK via the control terminal. In other words, the first flip-flop loop 110*a* may generate the QA2 signal that has 5 T as a cycle and has a phase gap of 0.5 T from the phase of the QA1 signal.

In the above-described process of generating the QA1 signal and the QA2 signal, by applying the signal inverted from the clock signal CLK to the control terminal of the flip-flop 113*a* and the clock signal CLK to the control terminal of the flip-flop 112*a* that is serially connected to the flip-flop 113*a*, in order, signals having a phase gap of half a cycle therebetween may be generated.

The flip-flop 111*a* may receive the signal inverted from the dock signal CLK via the control terminal and receive the QA2 signal (from the flip flop 112*a*) via the D input terminal, thereby outputting the QA signal via the $\overline{Q}$ output terminal.

In other words, the first flip-flop loop 110a may generate the QA signal that has 5 T as the cycle and has a phase gap of 0.5 T from a signal generated by inverting the QA2 signal.

Like the first flip-flop loop 110a, the second flip-flop loop 120a may also receive the frequency-divided signal S_DIV and generate a QB1 signal, a QB2 signal and a QB signal according to flip-flop operations.

According to an exemplary embodiment of the inventive concept, the second flip-flop loop 120a generates the QB1 signal based on the clock signal CLK, generates the QB2 signal based on the clock inversion signal $\overline{CLK}$, and generates the QB signal based on the clock signal CLK. In other words, the second flip-flop loop 120a is different from the first flip-flop loop 110a in that the first flip-flop loop 110a generates the QA1 signal based on the clock inversion signal $\overline{CLK}$, generates the QA2 signal based on the clock signal CLK, and generates the QA signal based on the clock inversion signal $\overline{CLK}$. The first flip-flop loop 110a and the second flip-flop loop 120a have different methods by which the clock signal CLK is applied to the plurality of flip-flops 111a through 113a and 121a through 123a.

Accordingly, the QA1 signal and the QB1 signal, the QA2 signal and the QB2 signal, and the QA signal and the QB signal may have same frequency-division ratios and phase gaps of 2.5 T, depending on orders in which the clock signal CLK is input to the control terminals of the plurality of flip-flops 111a through 113a and 121a through 123a and whether the clock signal CLK is inverted as it is input to the plurality of flip-flops 111a through 113a and 121a through 123a.

The divide core circuit 100a may generate the frequency-divided signal S_DIV, via the NAND gate 130 and the inverter 140, by using the QA signal and the QB signal respectively generated by the first flip-flop loop 110a and the second flip-flop loop 120a. The frequency-divided signal S_DIV may be fed back to the first flip-flop loop 110a and the second flip-flop loop 120a.

Referring to FIG. 4, the frequency-divided signal S_DIV may have a cycle of 2.5 T, which is 2.5 times the cycle T of the clock signal CLK. In addition, since a proportion of the logic-high voltage per cycle is 40%, the frequency-divided signal S_DIV may have a duty ratio of 40%.

The above-mentioned divided core circuits 100, 100a, and 100b may have a small number of flip-flops each including a small number of loops, thereby reducing frequency spur. In comparison to a frequency divider including many loops, a frequency is not accurately divided, and thus, a target frequency could be mixed with other frequencies. In, however, the frequency divider according to an exemplary embodiment of the inventive concept, by including the divide core circuit, the frequency-divided signal S_DIV having target frequency is obtained by using a method of alternately receiving the clock signal CLK and the clock inversion signal $\overline{CLK}$.

Figure 5:
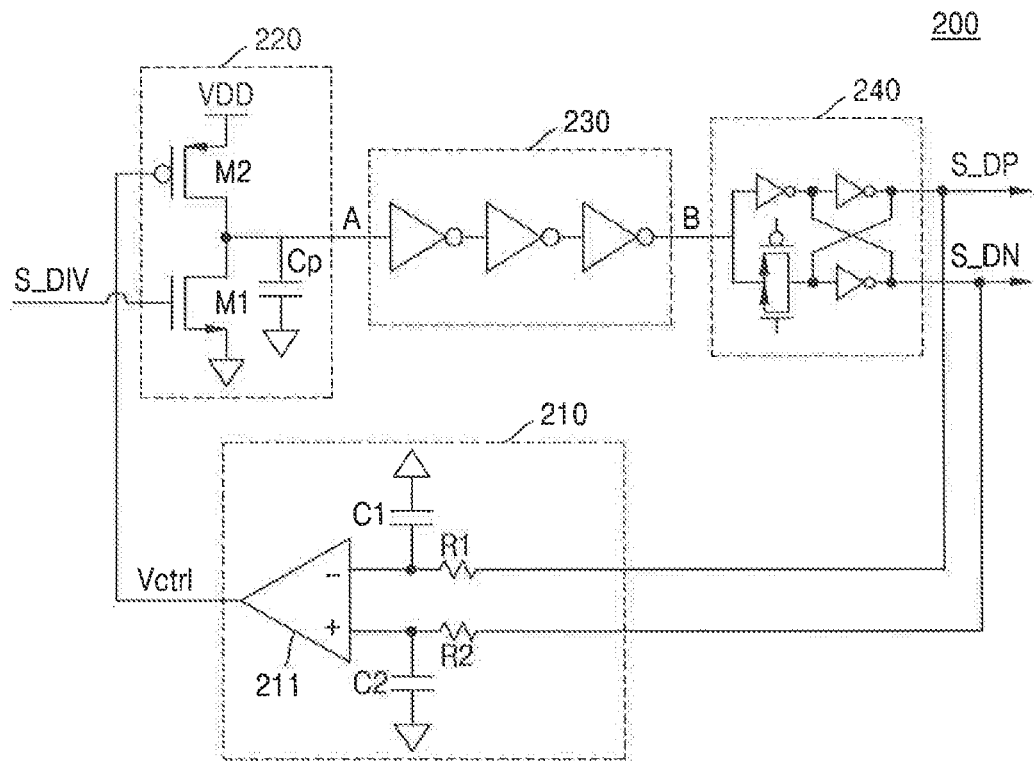
FIG. 5 is a circuit diagram of a duty correction circuit according to an exemplary embodiment of the inventive concept.
Figure 6:
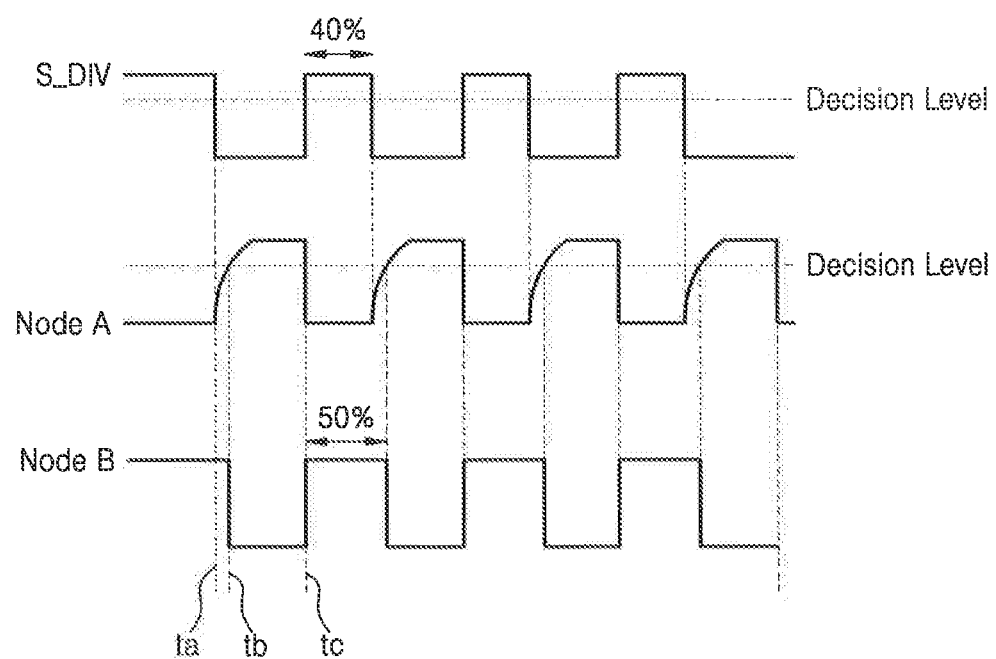
FIG. 6 is a timing diagram of signals generated by the duty correction circuit according to an exemplary embodiment of the inventive concept.

FIG. 5 is a circuit diagram of the duty correction circuit according to an exemplary embodiment of the inventive concept, and FIG. 6 is a timing diagram of signals generated by the duty correction circuit according to an exemplary embodiment of the inventive concept.

Referring to FIG. 5, the duty correction circuit 200 may include an operational amplifier circuit 210, a transistor circuit 220, an inverter circuit 230, and a differential conversion circuit 240.

According to an exemplary embodiment of the inventive concept, the duty correction circuit 200 receives a frequency-divided signal S_DIV and corrects the duty ratio of the frequency-divided signal S_DIV to a target duty ratio. For example, when the duty ratio of the frequency-divided signal S_DIV is 40%, the duty correction circuit 200 may correct the duty ratio to be 50% and output the corrected duty ratio. In addition, the duty correction circuit 200 may convert a unity signal into a duty differential signal.

According to an exemplary embodiment of the inventive concept, the operational amplifier circuit 210 may feedback the first differential output signal S_DP and the second differential output signal S_DN, which are output from an output terminal of the duty correction circuit 200, and receive the signals that are fed back. The operational amplifier circuit 210 may include a first RC filter including a resistor R1 and a capacitor C1 and a second RC filter including a resistor R2 and a capacitor C2 between an input terminal of an operational amplifier 211 and an output terminal of the duty correction circuit 200.

According to an exemplary embodiment of the inventive concept, the operational amplifier circuit 210 may receive the first differential output signal S_DP having a first voltage and a second voltage. In this case, the first differential output signal S_DP may have the form of a square wave. The first RC filter provided at an inversion input terminal (−) of the operational amplifier 211 may receive the first differential output signal S_DP and apply an average value of the first differential output signal S_DP to the inversion input terminal (−) of the operational amplifier 211.

The second differential output signal S_DN may also be a voltage having the form of a square wave. In this case, the second RC filter provided at a non-inversion input terminal (+) of the operational amplifier 211 may receive the second differential output signals S_DN and apply an average value of the second differential output signal S_DN to the non-inversion input terminal (+) of the operational amplifier 211.

According to an exemplary embodiment of the inventive concept, when an inversion input and a non-inversion input are different from each other, the operational amplifier 211 applies a control voltage Vctrl, which is changed according to time, to the transistor circuit 220. In this case, due to the principle of a virtual short, the inversion input and the non-inversion input of the operational amplifier 211 converge to a level at which the inversion input and the non-inversion input have one same average value.

When the inversion input and the non-inversion input are identical to each other, the operational amplifier 211 may control a control voltage Vctrl to have a uniform constant value. For example, when the first differential output signal S_DP and the second differential output signal S_DN are inverted with respect to each other, average values that are applied to input terminals of the operational amplifier 211 may be identical to each other. When the control voltage Vctrl has a constant value (for example, direct current (DC) 1.5V), a feedback loop process of the duty correction circuit 200 by using the operational amplifier circuit 210 is ceased. Accordingly, the operational amplifier circuit 210 applies a uniform control voltage Vctrl having the constant value to the transistor circuit 220 and outputs the first differential output signal S_DP and the second differential output signal S_DN in inverted forms.

According to an exemplary embodiment of the inventive concept, the transistor circuit 220 may include a first transistor M1 for receiving a frequency-divided signal S_DIV and a second transistor M2 that may be modeled by using a variable resistor according to the control voltage Vctrl.

The first transistor M1 may be operated as a common source amplifier. For example, the first transistor M1 may receive a frequency-divided signal S_DIV via a gate terminal, invert the frequency-divided signal S_DIV and output, to node A, the frequency-divided signal S_DIV that is inverted. In FIG. 5, the node A is connected to a drain terminal of the first transistor M1.

The second transistor M2 may, according to the control voltage Vctrl, correct a voltage applied to the node A to have a response with the form of an exponential function. In other words, an edge slope of the frequency-divided signal S_DIV may be adjusted according to the control voltage Vctrl that is generated based on the first differential output signal S_DP and the second differential output signal S_DN. An edge slope is a slope that occurs when a voltage or a current is transformed from a first value to a second value at rising time or falling time. For example, the second transistor M2 may be a variable resistor that varies according to the control voltage Vctrl, and the first transistor M1, the second transistor M2, and a parasitic capacitor Cp of the transistor circuit 220 may be connected to the node A in parallel. Accordingly, the transistor circuit 220 may receive the frequency-divided signal S_DIV and output a voltage having an edge slope based on a time constant, which is generated by multiplying a variable resistor that is changed according to the control voltage Vctrl by a value of the parasitic capacitor Cp, and may adjust the control voltage Vctrl and the edge slope, thereby adjusting the duty ratio.

The inverter circuit 230 may receive a voltage from the node A and output the voltage to node B. For example, the inverter circuit 230 may include a plurality of inverters serially connected and may adjust a duty ratio based on decision levels of the plurality of inverters.

Referring to FIG. 6, the frequency-divided signal S_DIV may include a logic-high voltage and a logic-low voltage each having a square form. The transistor circuit 220 may receive the frequency-divided signal S_DIV, invert the frequency-divided signal S_DIV via the first transistor M1, and output the frequency-divided signal S_DIV, via the second transistor M2 and the parasitic capacitor Cp, to have a response in the form of a numerical index. Accordingly, a voltage may be output as shown in a voltage graph of Node A shown in FIG. 6. Afterwards, each of the inverters included in the inverter circuit 230 may output a voltage lower than the decision level as a logic-low voltage and may output a voltage higher than the decision level as a logic-high voltage.

For example, at a time point ta, the frequency-divided signal S_DIV is transformed from the logic-high voltage to the logic-low voltage. The transistor circuit 220 may invert the frequency-divided signal S_DIV, adjust the edge slope of the frequency-divided signal S_DIV, and output, to Node A, the frequency-divided signal S_DIV having the adjusted edge slope. For example, the signal indicated by Node A in FIG. 6 after the time point ta and before a time point tb, has the adjusted edge slope. The time point tb is a time point at which a decision level of an inverter is equal to a voltage level.

Afterwards, via the inverter circuit 230, a square wave having a duty ratio fixed to 50% may be obtained, according to the decision level. For example, the transistor circuit 220 may, when an odd number of inverters is included in the inverter circuit 230, through Node B, output a periodic square wave that has a logic-high voltage before the time point tb and a logic-low voltage after the time point tb.

At a time point tc at which the frequency-divided signal S_DIV is transformed from the logic-low voltage to the logic-high voltage, a falling time may be extremely short or not exist. At the time point tc, the first transistor M1 that is operated by using the common source amplifier (e.g., operational amplifier 211) is turned off, and as the node A is momentarily grounded, a voltage of the node A may drop in the form of a step function without falling time.

Referring again to FIG. 5, the differential conversion circuit 240 may convert the single signal, which is input to the differential conversion circuit 240 from the inverter circuit 230, to differential signals and output the converted differential signals. The differential signals may be the first differential output signal S_DP and the second differential output signal S_DN. Each of the first differential output signal S_DP and the second differential output signal S_DN is a signal having a phase inverted by 180 degrees from that of the other signal. According to an exemplary embodiment of the inventive concept, the differential conversion circuit 240 may, by using an even number of inverters that are serially connected, output the first differential output signal S_DP that has a same phase as that of the frequency-divided signal S_DIV and a duty ratio of 50%. In addition, the differential conversion circuit 240 may, by using a common gate amplifier and inverters, output the second differential output signal S_DN having a phase inverted from that of the first differential output signal S_DP.

Figure 7A:
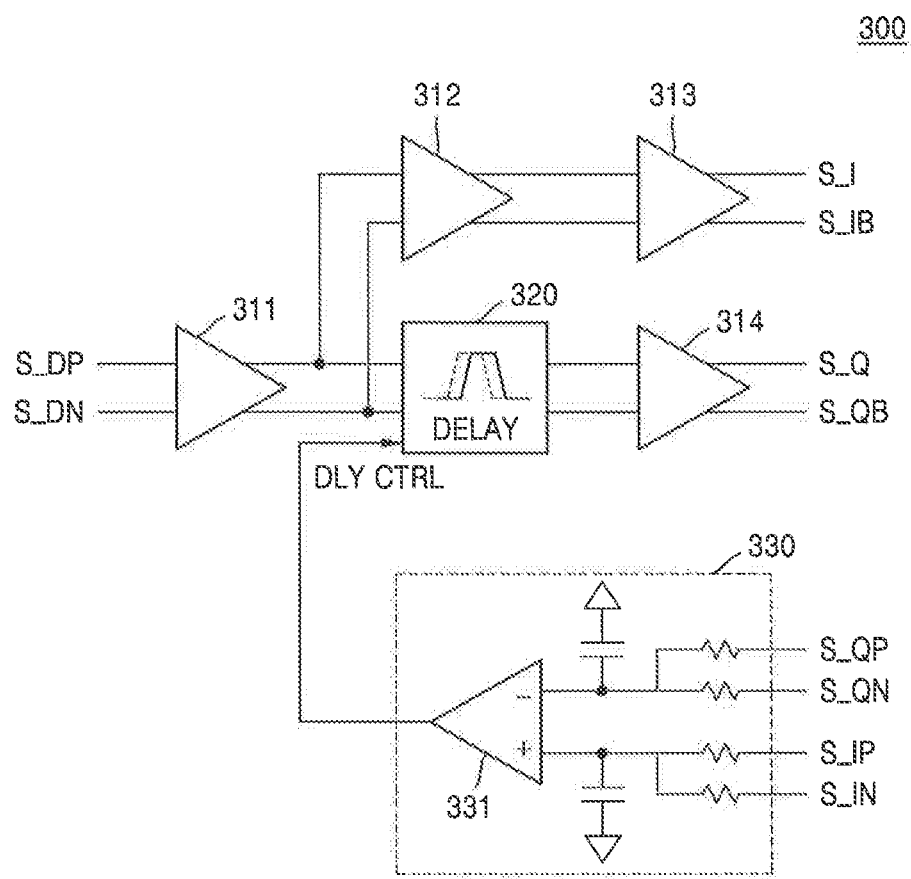
FIG. 7A is a circuit diagram of an output circuit according to an exemplary embodiment of the inventive concept.
Figure 7B:
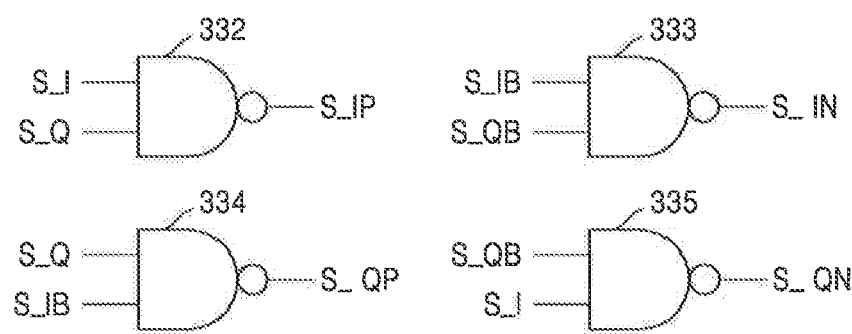
FIG. 7B is a diagram of a logic circuit included in the output circuit according to an exemplary embodiment of the inventive concept.

FIG. 7A is a circuit diagram of the output circuit according to an exemplary embodiment of the inventive concept, and FIG. 7B is a diagram of logic circuits included in the output circuit according to an exemplary embodiment of the inventive concept.

Referring to FIG. 7A, the output circuit 300 may include an input buffer 311, a plurality of output buffers, for example, first, second, and third output buffers 312, 313 and 314, a phase delay circuit 320, and an operation amplifier circuit 330.

According to an exemplary embodiment of the inventive concept, the output circuit 300 may receive a first differential output signal S_DP and a second differential output signal S_DN via the input buffer 311. The first output buffer 312 and the second output buffer 313 may respectively amplify the signals amplified by the input buffer 311 and output an I signal S_I and an IB signal S_IB. In other words, the I signal S_I and the IB signal S_IB may be output by fixing phases and amplifying magnitudes of the first differential output signal S_DP and the second differential output signal S_DN.

According to an exemplary embodiment of the inventive concept, the phase delay circuit 320 may, based on a delay control signal DLY CTRL, delay phases of input signals. The third output buffer 314 amplifies the signals output from the phase delay circuit 320 and outputs a Q signal S_Q and a QB signal S_QB.

According to an exemplary embodiment of the inventive concept, the operational amplifier circuit 330 may output a delay control signal DLY CTRL, based on a plurality of input signals S_QP, S_QN, S_IP, and S_IN that are received. In other words, the operational amplifier circuit 330 may output the delay control signal DLY CTRL in response to input signals S_QP, S_QN, S_IP and S_IN. In this case, a biasing circuit may be added to the output terminal of the operational amplifier 331, and the biasing circuit may redistribute a voltage according to an input required by the phase delay circuit 320 and, input the voltage, which is redistributed, to the phase delay circuit 320.

The plurality of input signals S_QP, S_QN, S_IP, and S_IN received by the operational amplifier circuit 330 are signals generated by performing feedback on the plurality of output signals S_I, S_IB, S_Q, and S_QB that are output by the output circuit 300. Details thereof will be described with reference to FIG. 7B.

Referring to FIG. 7B, a plurality of NAND gates 332, 333, 334 and 335 may receive the plurality of output signals S_I, S_IB, S_Q, S_QB output by the output circuit 300 and generate the input signals S_IP, S_IN, S_QP, and S_QN of the operational amplifier circuit 330. The plurality of NAND gates 332 through 335 may be included in the output circuit 300 and may also be included in the operational amplifier circuit 330. In other words, the plurality of NAND gates 332 through 335 may be included between the second output buffer 313, the third output buffer 314, and RC filters included in the operational amplifier circuit 330.

Referring again to FIG. 7A, an RC filter connected to an inversion input terminal (−) of the operational amplifier 331 applies an output due to the QP signal S_QP and the QN signal S_QN to the inversion input terminal (−) of the operational amplifier 331. An RC filter connected to a non-inversion input terminal (+) of the operational amplifier 331 applies an output due to the IP signal S_IP and the IN signal S_IN to the non-inversion input terminal (+) of the operational amplifier 331.

The operational amplifier 331 outputs a voltage of the delay control signal DLY CTRL as a constant value when an average of the QP signal S_QP and the QN signal S_QN and an average of the IP signal S_IP and the IN signal S_IN, passing through each of the RC filters, are equal to each other (in other words, when an inversion input and a non-inversion input of the operational amplifier 331 are equal to each other). When the output signal of the output circuit 300 is an orthogonal signal, the operational amplifier 331 outputs the delay control signal DLY CTRL as a constant value. For example, when the I signal S_I and the Q signal S_Q are orthogonal to each other, and the IB signal S_IB and the QB signal S_QB are orthogonal to each other, average values of voltages input to the inversion input terminal (−) and the non-inversion input terminal (+) of the operational amplifier 331 are identical to each other.

When the delay control signal DLY CTRL is received as the constant value, the phase delay circuit 320 no longer performs the phase delay. In other words, the delay operation performed by the operational amplifier circuit 330 is locked.

Figure 8:
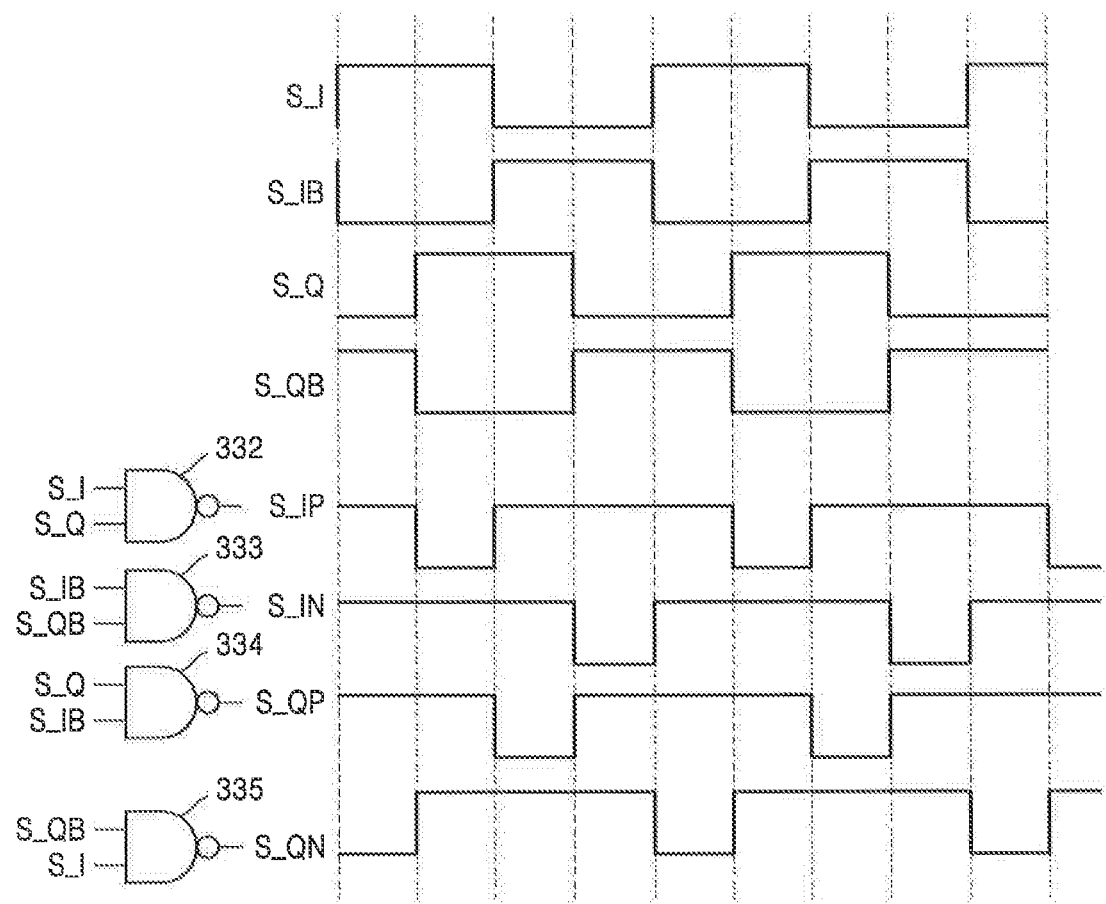
FIG. 8 is a timing diagram of signals generated by the output circuit, according to an exemplary embodiment of the inventive concept.

FIG. 8 is a timing diagram of signals generated by the output circuit, according to an exemplary embodiment of the inventive concept. For convenience of explanation, FIG. 8 will be described by using identifiers used in FIGS. 7A and 7B.

Referring to FIG. 8, the I signal S_I and the IB signal S_IB are inverted with respect to each other, and the Q signal S_Q and the QB signal S_QB are inverted with respect to each other. The I signal S_I and the Q signal S_Q may be orthogonal with respect to each other, and the IB signal S_IB and the QB signal S_QB may be orthogonal with respect to each other. In other words, the plurality of output signals S_I, S_IB, S_Q, and S_QB, which are output from the output circuit 300, may be signals orthogonal to one another.

A plurality of signals S_IP, S_IN, S_QP, and S_QN, which are input to the operational amplifier circuit 330, are signals obtained by applying the plurality of output signals S_I, S_IB, S_Q, and S_QB, which are output from the output circuit 300, to the NAND gates 332 through 335. By doing so, the Q signal S_Q output from the output circuit 300 is delayed by 90 degrees compared to the I signal S_I, and the QB signal S_QB is delayed by 90 degrees compared to the IB signal S_IB.

For example, the IP signal S_IP is generated by a negative-AND (NAND) operation on the I signal S_I and the Q signal S_Q, the IN signal S_IN is generated by a NAND operation on the IB signal S_IB and the QB signal S_QB, the QP signal S_QP is generated by a NAND operation on the Q signal S_Q and the IB signal S_IB, and the QN signal S_QN is generated by a NAND operation on the QB signal S_QB and the I signal S_I.

Figure 9:
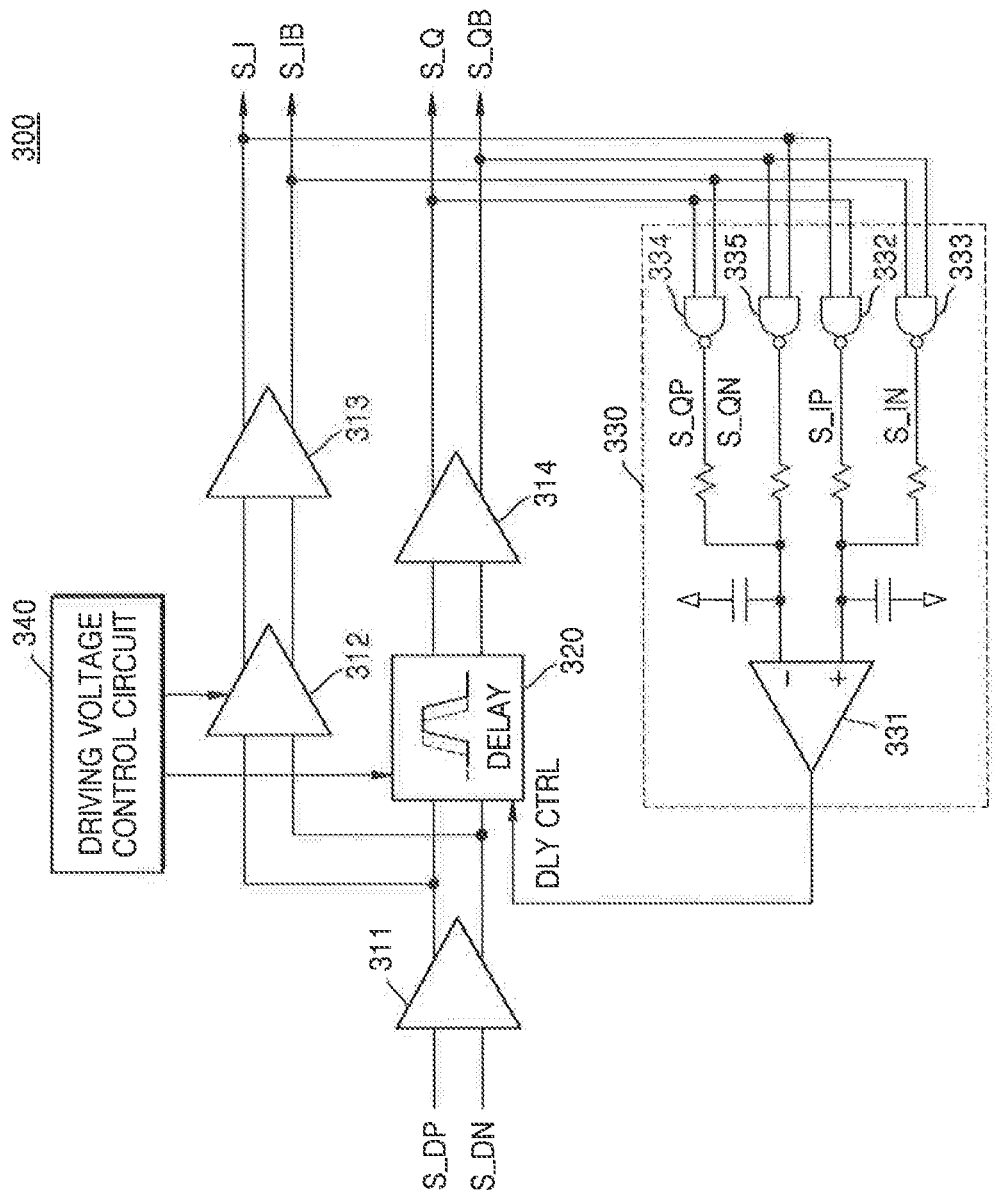
FIG. 9 is a circuit diagram of the output circuit according to an exemplary embodiment of the inventive concept.

FIG. 9 is a circuit diagram of the output circuit according to an exemplary embodiment of the inventive concept.

Referring to FIG. 9, the output circuit 300 may further include a driving voltage control circuit 340, and an output terminal of the output circuit 300 may be connected to an input terminal of the operation amplifier circuit 330.

According to an exemplary embodiment of the Inventive concept, the driving voltage control circuit 340 may, according to process, voltage, and temperature (PVT) conditions, provide driving voltages for at least one of the first, second, and third output buffers 312, 313 and 314 and the phase delay circuit 320. Phases of the components included in the output circuit 300 may be easily changed according to the PVT conditions.

According to another exemplary embodiment of the inventive concept, the driving voltage control circuit 340 may be placed outside the output circuit 300, and in this case, the driving voltage control circuit 340 may control not only driving voltages provided to components of the output circuit 300 but also driving voltages provided to flip-flops of the divide core circuit 100, the operational amplifier circuit 210, the inverter circuit 230, and the differential conversion circuit 240 of the duty correction circuit 200.

Figure 10:
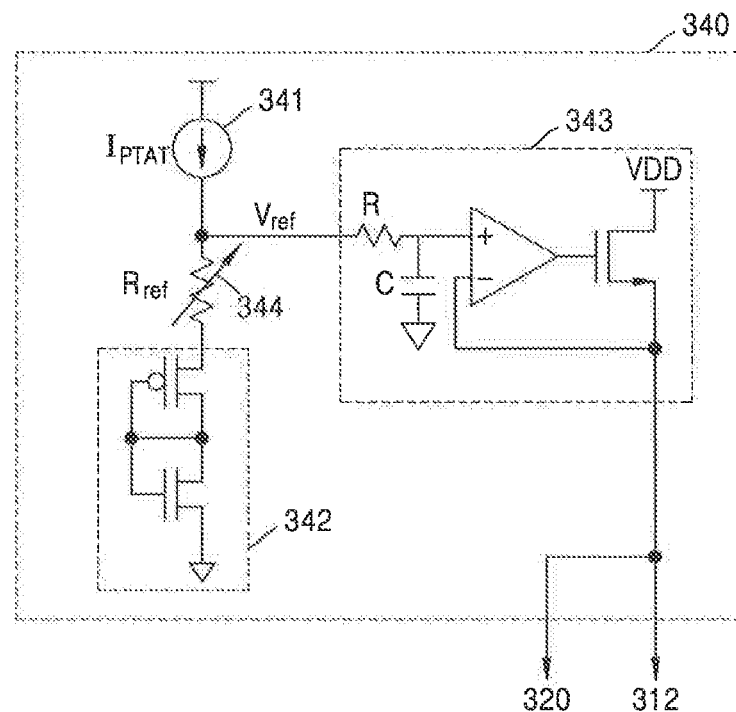
FIG. 10 is a circuit diagram of a driving voltage control circuit according to an exemplary embodiment of the inventive concept.

FIG. 10 is a circuit diagram of the driving voltage control circuit 340 according to an exemplary embodiment of the inventive concept.

Referring to FIG. 10, the driving voltage control circuit 340 may include a current source 341, a diode 342, a voltage regulator 343, and a reference resistor 344.

According to an exemplary embodiment of the inventive concept, the current source 341 may generate a current that is proportional to absolute temperature (PTAT). The generation of the PTAT is for controlling a driving voltage that is applied to the output circuit 300 due to temperature changes from among the PVT conditions. The voltage regulator 343 may, for example, be a Low Dropout (LDO) regulator.

According to an exemplary embodiment of the inventive concept, a reference voltage $V_{ref}$ node is connected in parallel to the current source 341 and the voltage regulator 343, and the reference voltage $V_{ref}$ node is further connected in parallel to the diode 342 and the reference resistor 344 that are serially connected to each other. Accordingly, a reference voltage $V_{ref}$ may be represented by Formula 1 as follows:

$$V_{ref} = I_{PTAT} \cdot R_{ref} + 2 \cdot (V_{ov} + V_{th}) \qquad \text{[Formula 1]}$$

Herein, $V_{ov}$ and $V_{th}$ respectively indicate an over drive voltage and a threshold voltage of the diode 342.

According to the reference voltage $V_{ref}$ described above, the voltage regulator 343 may provide driving voltages, which are changed according to temperatures, to the phase delay circuit 320 and the first output buffer 312. In other words, phase delay fluctuation due to temperature changes may be reduced by providing different voltages according to temperature changes, instead of directly providing a power supply voltage (VDD).

Figure 11:
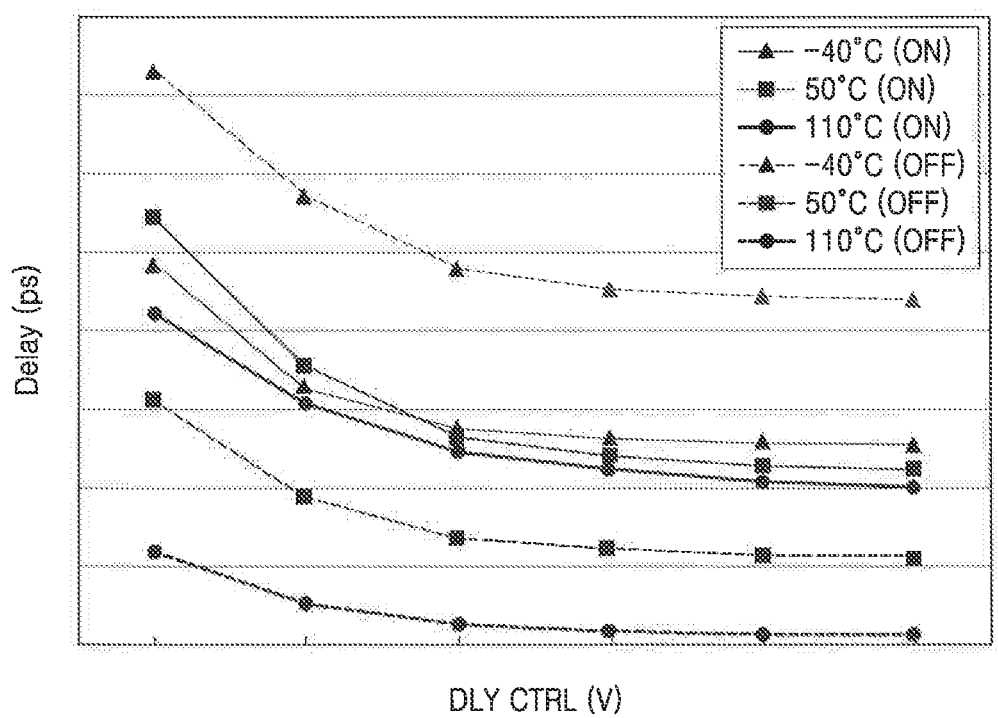
FIG. 11 is a graph of delay time when the driving voltage control circuit is operated according to an exemplary embodiment of the inventive concept and FIG. 12 is a block diagram of a transceiver according to an exemplary embodiment of the inventive concept.

FIG. 11 is a graph of delay time when the driving voltage control circuit is operated according to an exemplary embodiment of the inventive concept.

Referring to FIG. 11, the horizontal axis represents a voltage of the control signal DLY CTRL of the operational amplifier circuit 330 in the output circuit 300 used to control the phase delay circuit 320, and the vertical axis represents delay time in pico-second units. In the case that the driving voltage control circuit 340 is used in the duty correction circuit 200, when the driving voltage control circuit 340 provides a drive voltage to the operational amplifier circuit 210 of the duty correction circuit 200, the horizontal axis may represent a control voltage Vctrl output by the operational amplifier 211.

Referring to FIG. 11, solid lines of the graph indicate a delay time when a drive voltage is provided to the output circuit 300 via the driving voltage control circuit 340, and broken lines of the graph indicate a delay time when a power voltage is provided to the output circuit 300 as a drive voltage.

According to an exemplary embodiment of the inventive concept, when the driving voltage control circuit 340 provides a driving voltage to the phase delay circuit 320, according to temperature changes of −40, 50, and 110, the change in time delayed by the phase delay circuit 320 decreases, and thus, decrease in an error range may be identified. On the other hand, when the driving voltage VDD is directly applied to the phase delay circuit 320, there is a strong fluctuation of delay time due to temperature changes, and thus, phase delay performance is deteriorated.

Figure 12:
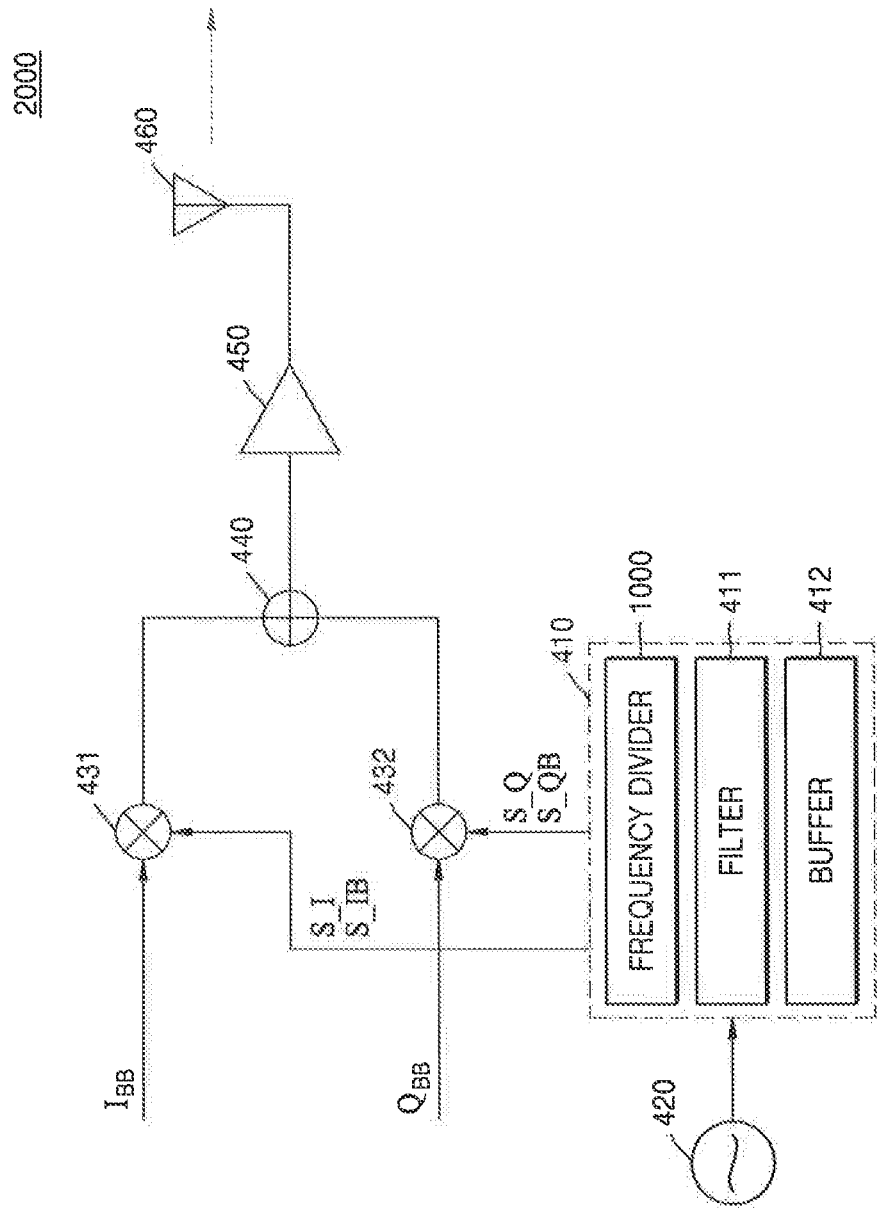

FIG. 12 is a block diagram for describing a transceiver according to an exemplary embodiment of the inventive concept.

Referring to FIG. 12, a transceiver 2000 may include a local oscillator 410, a signal source 420, mixers, for example, first and second mixers 431 and 432, an adder 440, a power amplifier 450, and an antenna 460. As shown in FIG. 12, the local oscillator 410 may include the frequency divider 1000, a filter 411, and a buffer 412.

The local oscillator 410 may generate a clock signal CLK based on an alternating current signal received from the signal source 420. The local oscillator 410 adjusts various characteristics of the clock signal CLK and outputs the clock signal CLK via the mixers 431 and 432. The frequency divider 1000 may be implemented like one of the various embodiments described in FIGS. 1 through 13. In other words, the frequency divider 1000 receives a clock signal CLK and divides frequency of the clock signal CLK in the divide core circuit 100, corrects a duty ratio of the clock signal CLK in the duty correction circuit 200, and outputs, from the output circuit 300, the output signals S_I, S_IB, S_Q, and S_QB that are orthogonal to one another, to the first and second mixers 431 and 432.

According to an exemplary embodiment of the inventive concept, the first mixer 431 mixes an I signal $I_{BB}$ in a baseband with the first output signals S_1 and S_IB, the second mixer 432 mixes a Q signal $Q_{BB}$ in a baseband with the second output signals S_Q and S_QB, and the first mixer 431 and the second mixer 432 output the mixed signals to the adder 440. In this case, I and Q may be components orthogonal to each other. An IQ signal summed up in the adder 440 is amplified in the power amplifier 450, and the IQ signal that is amplified is output, via the antenna 460, as frequency in a radio frequency (RF) band.

An exemplary embodiment of the inventive concept provides a frequency divider which reduces frequency spur due to a small number of flip-flop loops, corrects a duty ratio, and outputs a quadrature signal, and a transceiver including the frequency divider.

Furthermore, the frequency divider according to an exemplary embodiment of the inventive concept and the transceiver including the same may reduce a pulling effect and frequency spur while correcting duty ratios and outputting quadrature signals.

While the inventive concept has been particularly shown and described with reference to exemplary embodiments thereof, it will be understood by those of ordinary skill in the art that various modifications may be without departing from the scope of the inventive concept is defined by the appended claims.

What is claimed is:

1. A frequency divider, comprising:
a core circuit comprising a first flip-flop loop and a second flip-flop loop, wherein each of the first flip-flop loop and the second flip-flop loop divides a frequency of a clock signal received via a control terminal of a flip-flop, wherein the core circuit is configured to:
output a frequency-divided signal, based on a first signal output by the first flip-flop loop and a second signal output by the second flip-flop loop, the first and second signals having same frequency-division ratios and different phases, and feed back the frequency-divided signal via an input terminal of each of the first and second flip-flop loops;
a duty correction circuit that receives the frequency-divided signal and outputs a differential output signal that is generated by correcting a duty ratio of the frequency-divided signal; and
an output circuit that outputs a first output signal, which is a signal amplified from the differential output signal, and a second output signal that is a quadrature signal of the first output signal.

2. The frequency divider of claim 1, wherein the first flip-flop loop and the second flip-flop loop each comprise the same number of flip-flops, and each control terminal of the flip-flops receives the clock signal or a signal that is inverted from the clock signal.

3. The frequency divider of claim 2, wherein each of the flip-flops in the first flip-flop loop is serially connected, and a first flip-flop in the first flip-flop loop receiving the clock signal and a second flip-flop in the first flip-flop loop receiving the signal, that is inverted from the clock signal, are alternately connected to one another, and
each of the flip-flops in the second flip-flop loop is serially connected, and a first flip-flop in the second flip-flop loop receiving the clock signal and a second flip-flop in the second flip-flop loop receiving the signal, that is inverted from the clock signal, are alternately connected to one another.

4. The frequency divider of claim 3, wherein the frequency-divided signal is output by performing an AND operation on the first and second signals that are respectively output from the first flip-flop loop and the second flip-flop loop.

5. The frequency divider of claim 1, wherein duty ratios of the differential output signal, the first output signal, and the second output signal are corrected to be 50%.

6. The frequency divider of claim 1, wherein the duty correction circuit further comprises a transistor circuit, wherein an input terminal of the duty correction circuit is connected to the transistor circuit, and
the duty correction circuit feeds back the differential output signal to the transistor circuit, and adjusts the duty ratio of the frequency-divided signal by adjusting an edge slope of the frequency-divided signal based on the differential output signal.

7. The frequency divider of claim 6, wherein the duty correction circuit further comprises a first operational amplifier,
wherein an output terminal of the duty correction circuit, via which the differential output signal is output, is electrically connected to an input terminal of the first operational amplifier, and an output terminal of the first operational amplifier is electrically connected to the input terminal of the duty correction circuit, to which the frequency-divided signal is input.

8. The frequency divider of claim 7, wherein the first operational amplifier receives the differential output signal and generates a control signal that adjusts the edge slope of the frequency-divided signal, and the transistor circuit, in response to the control signal, adjusts the edge slope of the frequency-divided signal.

9. The frequency divider of claim 8, wherein the transistor circuit comprises a first transistor and second transistor, wherein the frequency-divided signal is applied to a gate terminal of the first transistor, and the control signal is applied to a gate terminal of the second transistor, and wherein the transistor circuit adjusts the edge slope of the frequency-divided signal by using the first transistor and the second transistor.

10. The frequency divider of claim 9, further comprising: a resistor-capacitor (RC) filter that is connected to the output terminal of the duty correction circuit and the input terminal of the first operational amplifier.

11. The frequency divider of claim 1, further comprising: a driving voltage control circuit that controls levels of a driving voltage provided to the output circuit, according to process, voltage, and temperature (PVT) conditions.

12. The frequency divider of claim 11, wherein the driving voltage control circuit further comprises a current source that generates a current that is proportional to temperature and a voltage regulator that provides the driving voltage, based on the current that is generated by the current source.

13. The frequency divider of claim 1, wherein the output circuit further comprises an output buffer and a phase delay circuit,
wherein the first output signal is output via the output buffer, the second output signal is output via the phase delay circuit, and the phase delay circuit, based on the first output signal and the second output signal, delays a phase of the differential output signal such that the second output signal is orthogonal to the first output signal.

14. The frequency divider of claim 13, wherein the output circuit further comprises an operational amplifier circuit, and
the output circuit receives the first output signal and the second output signal at an input terminal of the operational amplifier circuit and outputs, from an output terminal of the operational amplifier circuit, a signal that controls a phase delay operation of the phase delay circuit, to the phase delay circuit.

15. A frequency divider, comprising:
a core circuit that receives a clock signal and outputs a frequency-divided signal which is generated by dividing a frequency of the clock signal; and
a duty correction circuit that receives the frequency-divided signal and outputs a differential output signal that has a new duty ratio according to decision levels,
wherein the duty correction circuit, by performing feedback on the differential output signal and adjusting an edge slope of the frequency-divided signal based on the differential output signal that is fed back, adjusts an original duty ratio such that the differential output signal has the new duty ratio.

16. The frequency divider of claim 15, wherein the duty correction circuit further comprises a first operational amplifier, wherein an output terminal of the duty correction circuit, via which the differential output signal is output, is electrically connected to an input terminal of the first operational amplifier, and an output terminal of the first operational amplifier is electrically connected to an input terminal of the duty correction circuit, to which the frequency-divided signal is input.

17. The frequency divider of claim 15, wherein the first operational amplifier receives the differential output signal and generates a control signal that adjusts the edge slope of the frequency-divided signal, and the duty correction circuit, in response to the control signal, adjusts the edge slope of the frequency-divided signal.

18. A transceiver, comprising:
a core circuit that receives a clock signal, outputs a frequency-divided signal that is generated by dividing a frequency of the clock signal, and comprises a first flip-flop loop and a second flip-flop loop each comprising a plurality of flip-flops;
a duty correction circuit that receives the frequency-divided signal and outputs a differential output signal that is generated by correcting a duty ratio of the frequency-divided signal; and
an output circuit that outputs a first output signal that is a signal amplified from the differential output signal, and a second output signal that is a signal delayed from the first output signal.

19. The transceiver of claim 18, further comprising:
a driving voltage control circuit,
wherein the output circuit comprises an output buffer and a phase delay circuit,
wherein the first output signal is a signal generated by amplifying the differential output signal by the output buffer, the second output signal is a signal delayed by the phase delay circuit, and a driving voltage for the output buffer and the phase delay circuit is provided by the driving voltage control circuit.

* * * * *